United States Patent
Shen et al.

(10) Patent No.: US 11,258,250 B2
(45) Date of Patent: Feb. 22, 2022

(54) OVER CURRENT PROTECTION WITH IMPROVED STABILITY SYSTEMS AND METHODS

(71) Applicant: SYNAPTICS INCORPORATED, San Jose, CA (US)

(72) Inventors: Dan Shen, Irvine, CA (US); Balakishan Challa, Irvine, CA (US); Lorenzo Crespi, Costa Mesa, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 247 days.

(21) Appl. No.: 16/209,898

(22) Filed: Dec. 4, 2018

(65) Prior Publication Data
US 2020/0176978 A1   Jun. 4, 2020

(51) Int. Cl.
*H02H 9/02* (2006.01)
*H02H 3/087* (2006.01)

(52) U.S. Cl.
CPC ............ *H02H 9/025* (2013.01); *H02H 3/087* (2013.01)

(58) Field of Classification Search
CPC .................................................. H02H 9/025
See application file for complete search history.

(56) References Cited

U.S. PATENT DOCUMENTS

| | | | |
|---|---|---|---|
| 5,200,708 A | 4/1993 | Morris et al. | |
| 6,653,899 B2 | 11/2003 | Organvidez et al. | |
| 7,286,010 B2 | 10/2007 | Chieng et al. | |
| 7,554,409 B1 | 6/2009 | Zhang et al. | |
| 7,643,264 B2 | 1/2010 | Shinobu | |
| 9,813,009 B1* | 11/2017 | Xu | H03K 17/165 |
| 2008/0204958 A1* | 8/2008 | Shearon | H02H 3/18 |
| | | | 361/93.9 |
| 2015/0055257 A1* | 2/2015 | Azuma | H02H 9/025 |
| | | | 361/18 |
| 2016/0308352 A1* | 10/2016 | Tsao | H02H 9/025 |
| 2017/0063076 A1* | 3/2017 | Hou | H02H 9/001 |
| 2019/0302816 A1* | 10/2019 | Tomioka | G05F 1/573 |
| 2020/0081466 A1* | 3/2020 | Ideno | G05F 1/575 |

* cited by examiner

*Primary Examiner* — Rafael O De Leon Domenech
(74) *Attorney, Agent, or Firm* — Paradice & Li LLP

(57) ABSTRACT

Systems and methods are provided for improved stability of driver amplifiers. In one example, a system includes an NMOSFET power device operable to generate a current signal at a drain terminal. The system further includes a current comparison amplifier operable to amplify a difference signal comprising a difference between a replica current signal of the NMOSFET power device and a reference current signal to drive a current comparison amplifier voltage output signal. The system further includes a PMOSFET clamp device comprising a source terminal coupled to a gate terminal of the NMOSFET power device operable to limit a voltage at the gate terminal of the NMOSFET power device responsive to the current comparison amplifier voltage output signal.

16 Claims, 5 Drawing Sheets

OVER CURRENT PROTECTION WITH IMPROVED STABILITY SYSTEMS AND METHODS

TECHNICAL FIELD

The present disclosure, in accordance with one or more examples, relates generally to processing analog signals and, more particularly for example, to improving over current protection within high performance amplifiers.

BACKGROUND

Many modern devices such as laptop computers, computer tablets, MP3 players, and smart phones provide high fidelity audio signals for internal or external speaker connectivity. Such systems may generate audio content digitally, convert the digital signal to an analog signal, amplify the analog signal, and deliver an amplified analog current signal to an audio transducer. In some high fidelity systems, a main stage driver amplifier circuit includes an over current protection circuit to limit a magnitude of an amplified current signal provided to a headphone speaker, for example. To prevent chip damage, over current protection circuits continuously monitor the amplified current signal provided to the headphone device. Unfortunately, conventional over current protection circuits may become unstable during an over current condition and require additional stabilizing elements such as a miller capacitor, for example, to maintain stability. However, addition of stabilizing capacitors may decrease bandwidth of the main stage driver amplifier circuit resulting in unwanted signal distortion and noise. Thus, a user may be subject to a less enjoyable experience using the headphone device. In view of the foregoing, there remains a need in the art for improved over current protection circuits that provide for improved over current protection stability and driver amplifier performance.

SUMMARY

The present disclosure provides systems and methods that address a need in the art for improved over current protection stability within amplifiers used in modern devices, such as modern devices that incorporate speaker connectivity.

In various examples, an over current protection circuit includes an NMOSFET power device operable to generate a current signal at a drain terminal, a current comparison amplifier operable to amplify a difference signal comprising a difference between a replica current signal of the NMOSFET power device and a reference current signal to drive a current comparison amplifier voltage output signal, and a PMOSFET clamp device comprising a source terminal coupled to a gate terminal of the NMOSFET power device operable to limit a voltage at the gate terminal of the NMOSFET power device responsive to the current comparison amplifier voltage output signal.

In various examples, an over current protection circuit includes a PMOSFET power device operable to generate a current signal at a drain terminal, a current comparison amplifier operable to amplify a difference signal comprising a difference between a replica current signal of the PMOSFET power device and a reference current signal to drive a current comparison amplifier voltage output signal, and an NMOSFET clamp device comprising a source terminal coupled to a gate terminal of the PMOSFET power device operable to limit a voltage at the gate terminal of the PMOSFET power device responsive to the current comparison amplifier voltage output signal.

In various examples, a method includes receiving a current signal from an NMOSFET power device, generating a replica current signal of the current signal, amplifying a difference signal comprising a difference between the replica current signal and a reference current signal to drive a current comparison amplifier voltage output signal, and limiting a voltage at a gate terminal of the NMOSFET power device by a PMOSFET clamp device responsive to the current comparison amplifier voltage output signal.

The scope of the present disclosure is defined by the claims, which are incorporated into this section by reference. A more complete understanding of the present disclosure will be afforded to those skilled in the art, as well as a realization of additional advantages thereof, by a consideration of the following detailed description of one or more examples. Reference will be made to the appended sheets of drawings that will first be described briefly.

BRIEF DESCRIPTION OF THE DRAWINGS

Aspects of the disclosure and their advantages can be better understood with reference to the following drawings and the detailed description that follows. It should be appreciated that like reference numerals are used to identify like elements illustrated in one or more of the figures, where showings therein are for purposes of illustrating examples of the present disclosure and not for purposes of limiting the same. The components in the drawings are not necessarily to scale, emphasis instead being placed upon clearly illustrating the principles of the present disclosure.

DETAILED DESCRIPTION

The present disclosure describes systems and methods that address a need in the art for improved over current protection circuits that provide for improved over current protection stability in modern devices that incorporate internal and external speaker amplifier functionality. The following discussion will be directed to a headphone driver amplifier with an over current protection circuit example. But it will be appreciated that the over current protection circuit disclosed herein may be implemented in other types of driver amplifier circuits such as, for example, a low drop-out regulator (LDO).

Figure 1:
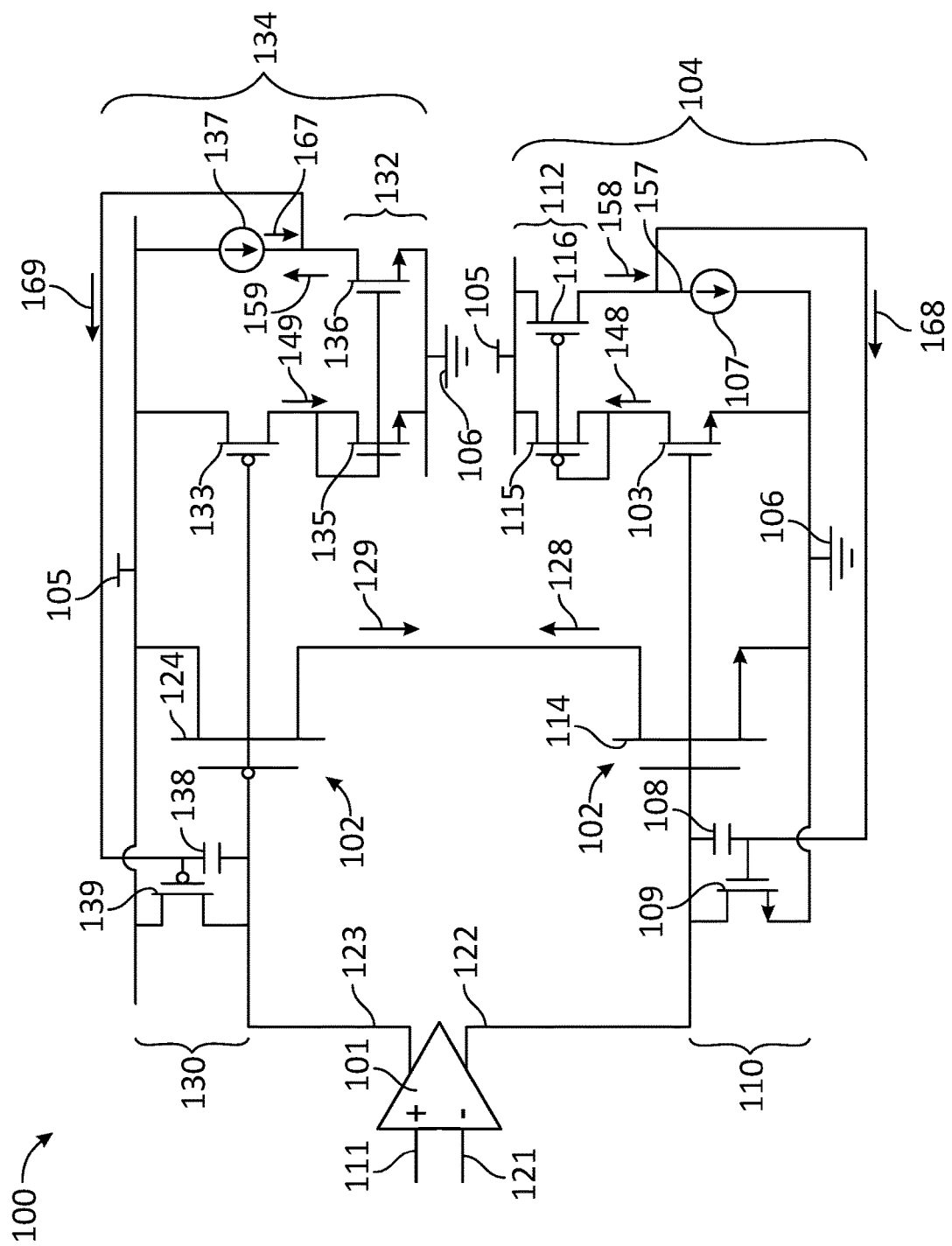
FIG. 1 illustrates a schematic diagram of a driver amplifier including a conventional over current protection circuit.

FIG. 1 illustrates a schematic diagram of a driver amplifier 100 including a conventional over current protection circuit. As shown in FIG. 1, the driver amplifier 100 includes a first stage amplifier 101, a main amplifier circuit 102, an over current protection circuit 104, and a complementary over current protection circuit 134. In this regard, first stage amplifier 101 provides differential amplified signals to main amplifier circuit 102 that provides amplified output current drive signals to drive a load. Over current protection circuit 104 and complementary over current protection circuit 134 provide for over current protection of amplified output current drive signals of main amplifier circuit 102.

First stage amplifier 101 receives a differential pair of input voltages, a positive input voltage 111 received at a non-inverting (+) terminal and a negative input voltage 121 received at an inverting (−) terminal of first stage amplifier 101. First stage amplifier 101 provides a negative amplified signal 122 at a gate terminal of an n-channel metal-oxide semiconductor field-effect transistor (NMOSFET) 114 and a positive amplified signal 123 at a gate terminal of a p-channel metal-oxide semiconductor field-effect transistor (PMOSFET) 124 of main amplifier circuit 102. A drain terminal of NMOSFET 114 provides an amplified output current drive signal 128 and a drain terminal of PMOSFET 124 provides an amplified output current drive signal 129 to drive a load (e.g., not shown). A source terminal of NMOSFET 114 is connected to analog ground 106 and a source terminal of PMOSFET 124 is connected to a DC voltage source 105. Over current protection circuit 104 and a complementary over current protection circuit 134 receive amplified output current drive signal 128 and amplified output current drive signal 129, respectively.

Over current protection circuit 104 includes a replica current sensor 103, a current mirror circuit 112, a reference current source 107, and a clamp device 110. Replica current sensor 103 senses amplified output current drive signal 128 of NMOSFET 114 and provides a scaled current signal 148 proportional to amplified output current drive signal 128. Current mirror circuit 112 includes a current mirror PMOSFET 115 and current mirror PMOSFET 116 implemented as a series pair and receives scaled current signal 148 at a drain terminal of current mirror PMOSFET 115 and provides a current mirror output signal 158 at a drain terminal of current mirror PMOSFET 116. Reference current source 107 is implemented to provide a reference current signal 157. A difference signal 168 comprising a difference between current mirror output signal 158 and reference current signal 157 is provided at a gate terminal of clamp NMOSFET 109 of clamp device 110. A drain terminal of clamp NMOSFET 109 is connected to gate terminal of NMOSFET 114, and clamp NMOSFET 109 controls a gate voltage of NMOSFET 114 to monitor and continuously limit the amplified output current drive signal 128 to a pre-determined maximum current drive level.

Complementary over current protection circuit 134 includes a complementary replica current sensor 133, a complementary current mirror circuit 132, a complementary reference current source 137, and a complementary clamp device 130. Complementary replica current sensor 133 senses amplified output current drive signal 129 of PMOSFET 124 and provides a scaled current signal 149 proportional to amplified output current drive signal 129. Complementary current mirror circuit 132 includes a current mirror NMOSFET 135 and a current mirror NMOSFET 136 implemented as a series pair and receives scaled current signal 149 at a drain terminal of current mirror NMOSFET 135 and provides a current mirror output signal 159 at a drain terminal of current mirror NMOSFET 136. Complementary reference current source 137 is implemented to provide a complementary reference current signal 167. A difference signal 169 comprising a difference between current mirror output signal 159 and complementary reference current signal 167 is provided at a gate terminal of clamp PMOSFET 139 of complementary clamp device 130. A drain terminal of clamp PMOSFET 139 is connected to gate terminal of PMOSFET 124 and clamp PMOSFET 139 controls a gate voltage of PMOSFET 124 to monitor and continuously limit the amplified output current drive signal 129 to a pre-determined minimum current drive level.

Over current protection circuit 104 of FIG. 1 includes two high impedance nodes that may make over current protection circuit 104 inherently unstable during an over current condition and cause oscillations within driver amplifier 100. A first high impedance node is at an output of current mirror circuit 112 (e.g., at the drain terminal of current mirror PMOSFET 116) and a second high impedance node at the output of clamp device 110 (e.g., at the drain terminal of clamp NMOSFET 109). Complementary over current protection circuit 134 includes similar locations with similar high impedance nodes. To reduce instability, driver amplifier 100 of FIG. 1 includes a miller capacitor 108 connecting gate terminal of clamp NMOSFET 109 to gate terminal of NMOSFET 114, and a miller capacitor 138 connecting gate terminal of clamp PMOSFET 139 to gate terminal of PMOSFET 124. Miller capacitor 108 and miller capacitor 138 each reduce a bandwidth of driver amplifier 100 which degrades amplifier performance and causes signal distortion and noise. Further, miller capacitor 108 and miller capacitor 138 require additional die area within driver amplifier 100 to cause an increase in die size of driver amplifier 100.

Accordingly, there is a need in the art for improved over current protection circuits that provide for improved over current protection stability and driver amplifier performance.

Figure 2:
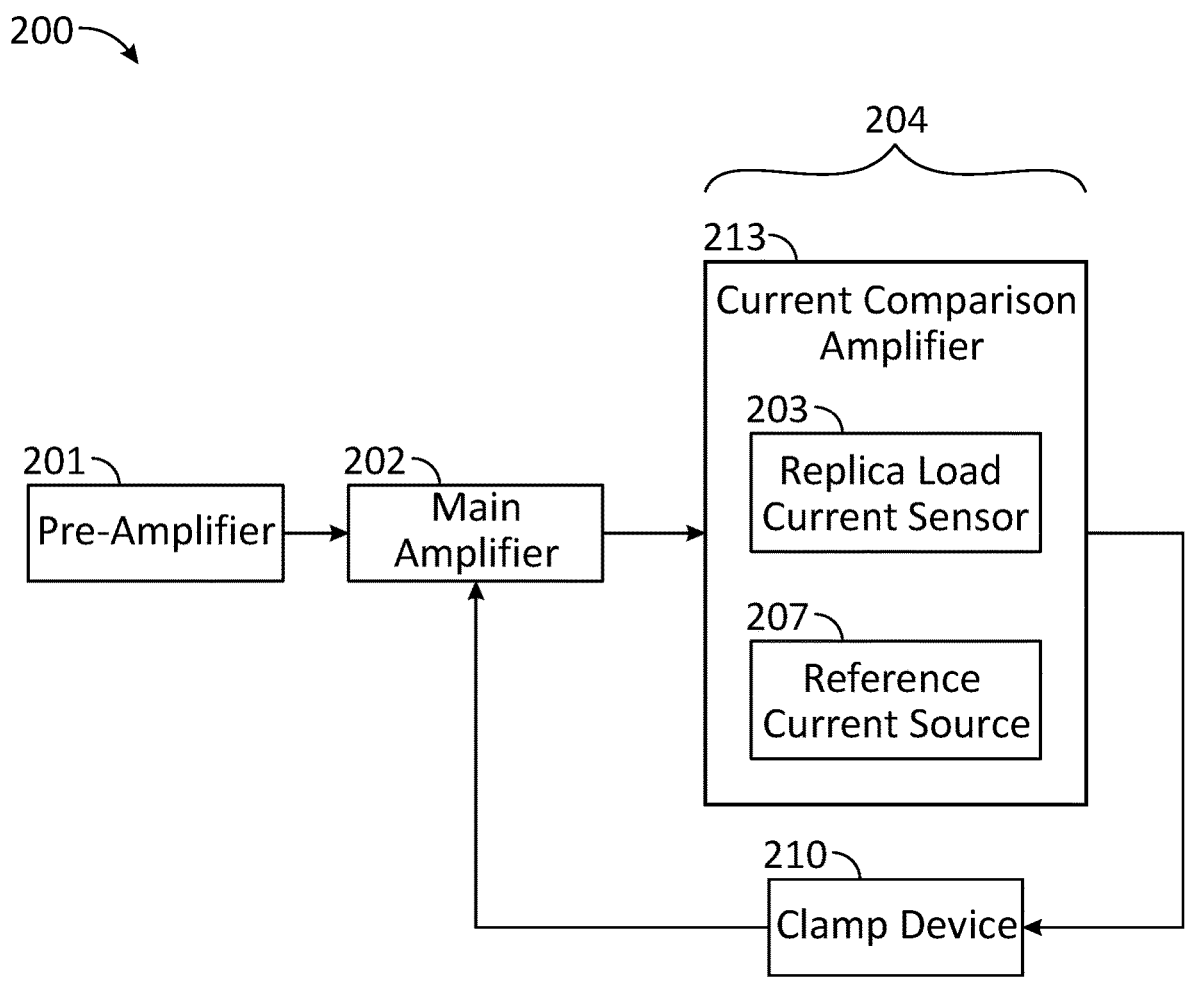
FIG. 2 illustrates an exemplary block diagram of a driver amplifier including an over current protection circuit in accordance with an example of the disclosure.

FIG. 2 illustrates an exemplary block diagram of driver amplifier 200 including an over current protection circuit 204 in accordance with an example of the disclosure. As shown in FIG. 2, driver amplifier 200 includes a pre-amplifier 201, a main amplifier 202, and an over current protection circuit 204. Pre-amplifier 201 provides amplified signals to an input of main amplifier 202 that further amplifies the signals and provides amplified output current signals to a load (e.g., not shown). Over current protection circuit 204 is coupled to main amplifier and provides for continuously sensing the amplified output current signal and limiting a current of the amplified output current signal to prevent main amplifier from providing a current to a load that may potentially damage the load or cause unwanted degradation in performance.

Figure 3:
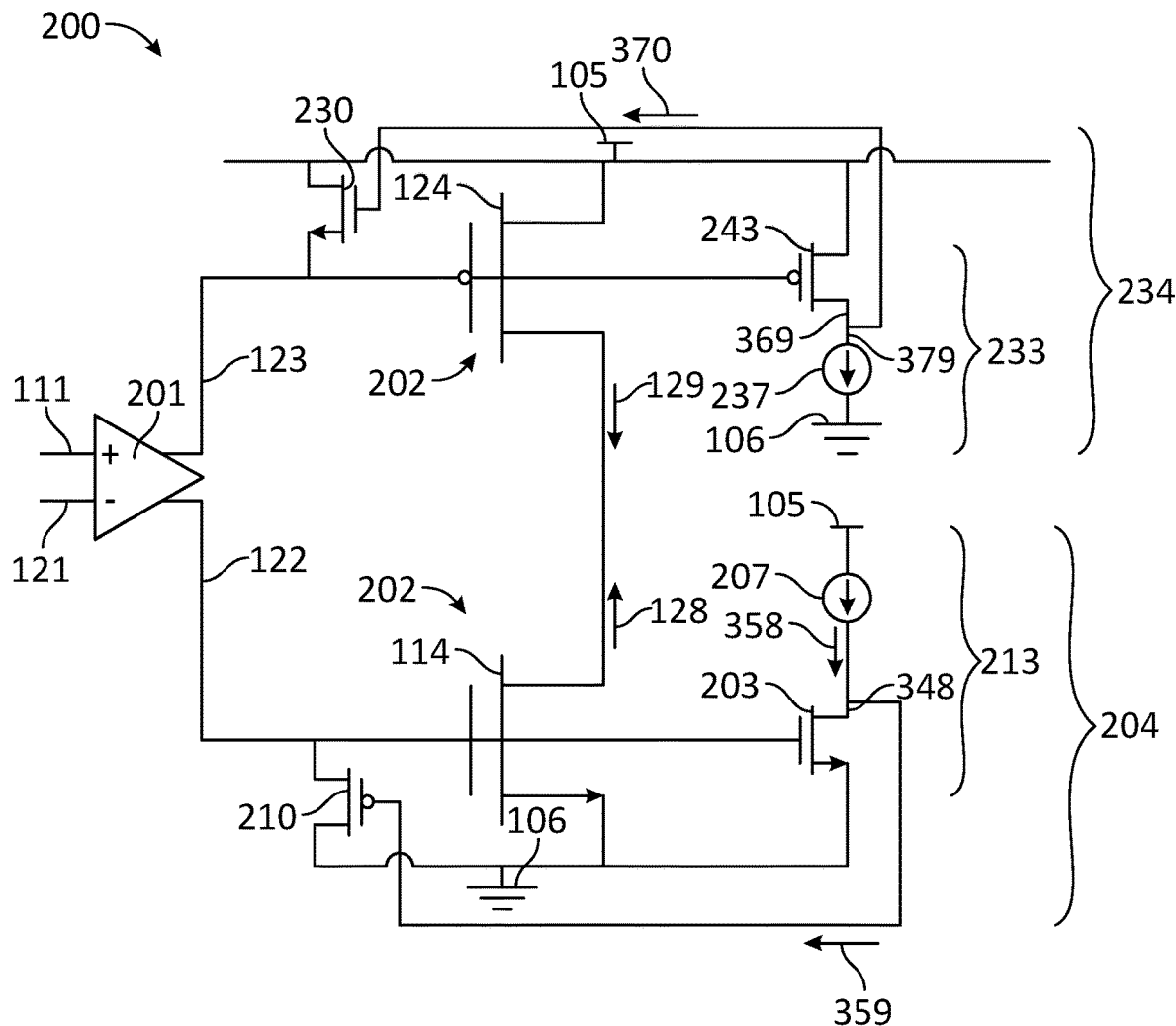
FIG. 3 illustrates an exemplary schematic diagram of a driver amplifier including an over current protection circuit in accordance with an example of the disclosure.

In some examples, over current protection circuit 204 includes a current comparison amplifier 213 and a PMOSFET clamp device 210 (e.g. such as PMOSFET clamp device 210 of FIG. 3). In various examples, current comparison amplifier 213 includes a replica load current sensor 203 and a reference current source 207. Replica load current sensor 203 senses the amplified output current signal and provides a replica current signal. Replica current signal is compared to a reference current signal generated by reference current source 207 to provide a difference signal. The difference signal is amplified and drives a current comparison amplifier voltage output signal. PMOSFET clamp device 210 receives the current comparison amplifier voltage output signal and limits a voltage at main amplifier 202 responsive to the current comparison amplifier voltage output signal.

The operation of driver amplifier 200 including over current protection circuitry is further described with reference to FIG. 3. FIG. 3 illustrates an exemplary schematic diagram of a driver amplifier 200 including an over current protection circuit. FIG. 3 shows driver amplifier 200 implemented as a headphone driver amplifier with over current protection circuitry. In this regard, over current protection circuitry includes an over current protection circuit 204 and an over current protection circuit 234. Operation of over current protection circuit 204 and over current protection circuit 234 are substantially similar and the differences between the two circuits will be described herein.

Pre-amplifier 201 receives a differential pair of input voltages, a positive input voltage 111 received at a non-inverting (+) terminal and a negative input voltage 121 received at an inverting (−) terminal. Pre-amplifier 201 provides a negative amplified signal 122 (e.g., an input drive signal) at a gate terminal of NMOSFET 114 and a positive amplified signal 123 (e.g. a second input drive signal) at a gate terminal of PMOSFET 124 of main amplifier 202. A drain terminal of NMOSFET 114 provides amplified output current drive signal 128 (e.g., a current signal) and a drain terminal of PMOSFET 124 provides an amplified output current drive signal 129 (e.g., a second current signal) to drive a load (e.g., not shown). A source terminal of NMOSFET 114 is connected to analog ground 106 and a source terminal of PMOSFET 124 is connected to a DC voltage source 105. In some examples, DC voltage source may be a voltage between three volts and five volts DC. It will be appreciated that other DC voltages are possible in other examples. Over current protection circuit 204 and a second over current protection circuit 234 receive amplified output current drive signal 128 and amplified output current drive signal 129, respectively.

Over current protection circuit 204 includes a current comparison amplifier 213 and a PMOSFET clamp device 210. Current comparison amplifier 213 includes a replica load current sensor 203 and a reference current source 207. In some examples, replica load current sensor 203 senses amplified output current drive signal 128 of NMOSFET 114 and generates a replica current signal 348. In this regard, replica load current sensor 203 is an NMOSFET device similar to NMOSFET 114 and is scaled by a factor N to reduce amplified output current drive signal 128 by a factor N to generate replica current signal 348 comprising a scaled current signal proportional to amplified output current drive signal 128. Reference current source 207 is implemented to generate a reference current signal 358. In some examples, reference current source 207 is implemented as a current source adapted to be selectable to limit the amplified output current drive signal 128 to a pre-determined maximum value.

In some examples, current comparison amplifier 213 is operable to amplify a difference signal comprising a difference between replica current signal 348 and reference current signal 358 to drive a current comparison amplifier voltage output signal 359. Current comparison amplifier voltage output signal 359 drives a gate terminal of PMOSFET clamp device 210. A source terminal of PMOSFET clamp device 210 is connected to gate terminal of NMOSFET 114 to control a gate voltage of NMOSFET 114. In this regard, PMOSFET clamp device 210 limits a voltage at gate terminal of NMOSFET 114 corresponding to a pre-determined maximum current signal to continuously monitor and limit the amplified output current drive signal 128 from NMOSFET 114.

It will be appreciated that current comparison amplifier 213 provides for a low impedance node at the source terminal of PMOSFET clamp device 210 connected to gate terminal of NMOSFET 114, and a single high impedance node at the drain terminal of replica load current sensor 203. In this regard, over current protection circuit 204 provides for an amplified output current drive signal 128 from NMOSFET 114 that is stable both during normal operation and during an over current condition without a miller capacitor.

Over current protection circuit 234 includes a second current comparison amplifier 233 and an NMOSFET clamp device 230. Second current comparison amplifier 233 includes a second replica load current sensor 243 and a second reference current source 237. In some examples, second replica load current sensor 243 senses amplified output current drive signal 129 of PMOSFET 124 and generates a replica second current signal 369. In this regard, second replica load current sensor 243 is a PMOSFET device similar to PMOSFET 124 and is scaled by a factor N to reduce amplified output current drive signal 129 by a factor N to generate replica second current signal 369 comprising a scaled current signal proportional to amplified output current drive signal 129. Second reference current source 237 is implemented to generate a second reference current signal 379. In some examples, second reference current source 237 is implemented as a current source adapted to be selectable to limit the amplified output current drive signal 129 to a pre-determined minimum value.

In some examples, second current comparison amplifier 233 is operable to amplify a second difference signal comprising a difference between replica second current signal 369 and second reference current signal 379 to drive a second current comparison amplifier voltage output signal 370. Second current comparison amplifier voltage output signal 370 drives a gate terminal of NMOSFET clamp device 230. A source terminal of NMOSFET clamp device 230 is connected to gate terminal of PMOSFET 124 to control a gate voltage of PMOSFET 124. In this regard, NMOSFET clamp device 230 limits a voltage at gate terminal of PMOSFET 124 corresponding to a pre-determined minimum current signal to continuously monitor and limit the amplified output current drive signal 129 from PMOSFET 124.

It will be appreciated that second current comparison amplifier 233 provides for a low impedance node at the source terminal of NMOSFET clamp device 230 connected to gate terminal of PMOSFET 124, and a single high impedance node at the drain terminal of second replica load current sensor 243. In this regard, over current protection circuit 234 provides for an amplified output current drive signal 129 from PMOSFET 124 that is stable both during normal operation and during an over current condition without a miller capacitor.

Figure 4:
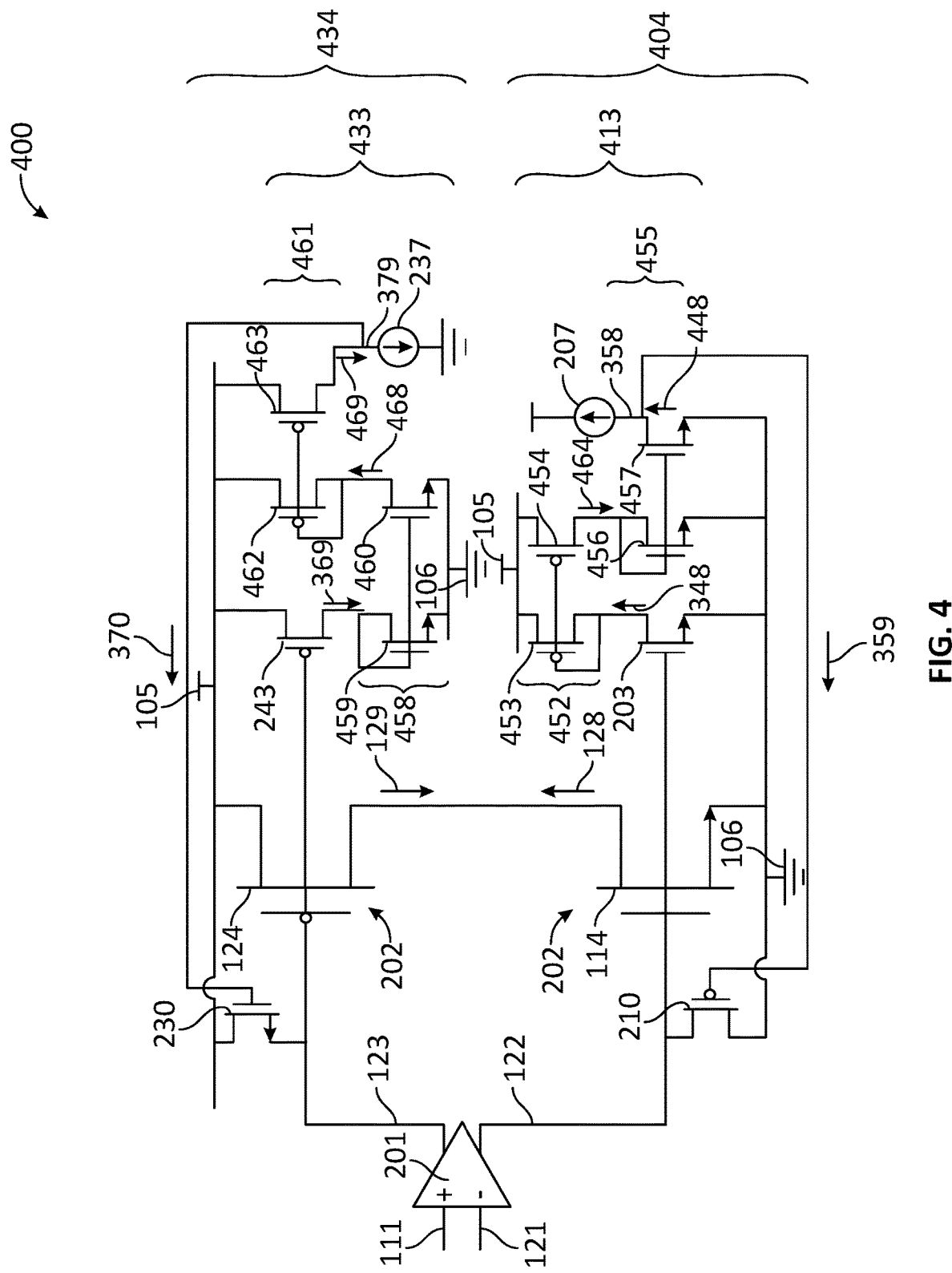
FIG. 4 illustrates an exemplary schematic diagram of an alternate example of a driver amplifier including an over current protection circuit in accordance with the disclosure.

FIG. 4 illustrates an exemplary schematic diagram of an alternate example of a driver amplifier 400 including an over current protection circuit. For example, FIG. 4 includes two current mirror circuits used in over current protection circuit 404 or over current protection circuit 434. In this regard, over current protection circuit 404 includes current comparison amplifier 413 and PMOSFET clamp device 210. Current comparison amplifier 413 includes replica load current sensor 203, a first current mirror circuit 452, a second current mirror circuit 455, and reference current source 207.

First current mirror circuit 452 includes a current mirror PMOSFET 453 and current mirror PMOSFET 454 implemented as a series pair and receives replica current signal 348 at a drain terminal of current mirror PMOSFET 453, and provides a current mirror output signal 464 at a drain terminal of current mirror PMOSFET 454. Second current mirror circuit 455 includes a current mirror NMOSFET 456 and a current mirror NMOSFET 457 implemented as a series pair and receives current mirror output signal 464 at a drain terminal of current mirror NMOSFET 456, and provides a current mirror output signal 448 at a drain terminal of current mirror NMOSFET 457. Current comparison amplifier 413 is operable to amplify a difference signal comprising a difference between current mirror output signal 448 and reference current signal 358 to drive a current comparison amplifier voltage output signal 359 to control PMOSFET clamp device 210. It will be appreciated that current comparison amplifier 413 provides for a low impedance node at the source terminal of PMOSFET clamp device 210 connected to gate terminal of NMOSFET 114, and a single high impedance node at the drain terminal of current mirror NMOSFET 457. In this regard, over current protection circuit 404 provides for an amplified output current drive signal 128 from NMOSFET 114 that is stable both during normal operation and during an over current condition.

Over current protection circuit 434 includes current comparison amplifier 433 and NMOSFET clamp device 230. Current comparison amplifier 433 includes second replica load current sensor 243, a first current mirror circuit 458, a second current mirror circuit 461, and second reference current source 237. First current mirror circuit 458 includes a current mirror NMOSFET 459 and current mirror NMOSFET 460 implemented as a series pair and receives replica second current signal 369 at a drain terminal of current mirror NMOSFET 459, and provides a current mirror output signal 468 at a drain terminal of current mirror NMOSFET 460. Second current mirror circuit 461 includes a current mirror PMOSFET 462 and current mirror PMOSFET 463 implemented as a series pair and receives current mirror output signal 468 at a drain terminal of current mirror PMOSFET 462 and provides a current mirror output signal 469 at a drain terminal of current mirror PMOSFET 463.

Current comparison amplifier 433 is operable to amplify a difference signal comprising a difference between current mirror output signal 469 and second reference current signal 379 to drive a second current comparison amplifier voltage output signal 370 to control NMOSFET clamp device 230. It will be appreciated that current comparison amplifier 433 provides for a low impedance node at the source terminal of NMOSFET clamp device 230 connected to gate terminal of PMOSFET 124, and a single high impedance node at the drain terminal of current mirror PMOSFET 463. In this regard, over current protection circuit 434 provides for an amplified output current drive signal 129 from PMOSFET 124 that is stable both during normal operation and during an over current condition.

Figure 5:
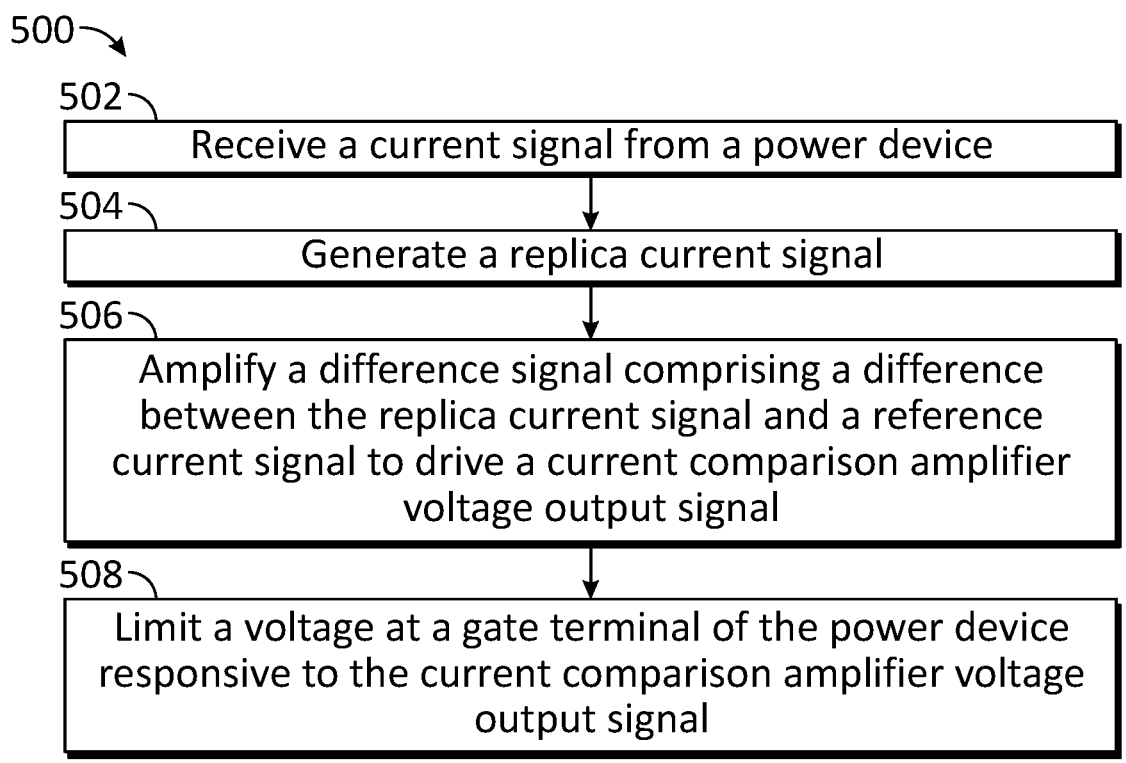
FIG. 5 is a flow chart illustrating a method for operation of an over current protection circuit in accordance with an example of the disclosure.

FIG. 5 is a flow chart illustrating a method 500 for operation of an over current protection circuit in accordance with an example of the disclosure. Method 500 begins with operations of step 502. In one example, operations of steps 502 is performed by a NMOSFET 114 and/or a PMOSFET 124 of driver amplifier 200. In another example, operations of steps 502 is performed by NMOSFET 114 and/or PMOSFET 124 of driver amplifier 400. NMOSFET 114 provides an amplified output current drive signal 128 and PMOSFET 124 provides an amplified output current drive signal 129 to drive a load, for example.

Method 500 may further include operations (step 504) of generating a replica current signal. In some examples, a replica load current sensor 203 senses amplified output current drive signal 128 of NMOSFET 114 and generates a replica current signal 348. In some examples, a second replica load current sensor 243 senses amplified output current drive signal 129 of PMOSFET 124 and generates a replica second current signal 369.

Method 500 may further include operations (step 506) of amplifying a difference signal comprising a difference between the replica current signal and a reference current signal to drive a current comparison amplifier voltage output signal. In some examples, a reference current source 207 is implemented to generate a reference current signal 358. Reference current source 207 may be implemented as a current source adapted to be selectable to limit the amplified output current drive signal 128 to a pre-determined maximum value. In some examples, a current comparison amplifier 213 is operable to amplify a difference signal comprising a difference between replica current signal 348 and reference current signal 358 to drive a current comparison amplifier voltage output signal 359.

In some examples, a second reference current source 237 is implemented to generate a second reference current signal 379. Second reference current source 237 is implemented as a current source adapted to be selectable to limit the amplified output current drive signal 129 to a pre-determined minimum value. In some examples, a second current comparison amplifier 233 is operable to amplify a second difference signal comprising a difference between replica second current signal 369 and second reference current signal 379 to drive a second current comparison amplifier voltage output signal 370.

Method 500 may further include operations (step 508) of limiting a gate terminal voltage of the power device responsive to the current comparison amplifier voltage output signal. In some examples, current comparison amplifier voltage output signal 359 drives a gate terminal of PMOSFET clamp device 210. A source terminal of PMOSFET clamp device 210 is connected to gate terminal of NMOSFET 114 to control a gate voltage of NMOSFET 114. In this regard, PMOSFET clamp device 210 limits a voltage at gate terminal of NMOSFET 114 corresponding to a pre-determined maximum current signal to continuously monitor and limit the amplified output current drive signal 128 from NMOSFET 114.

In some examples, second current comparison amplifier voltage output signal 370 drives a gate terminal of NMOSFET clamp device 230. A source terminal of NMOSFET clamp device 230 is connected to gate terminal of PMOSFET 124 to control a gate voltage of PMOSFET 124. In this regard, NMOSFET clamp device 230 limits a voltage at gate terminal of PMOSFET 124 corresponding to a pre-determined minimum current signal to continuously monitor and limit the amplified output current drive signal 129 from PMOSFET 124.

In view of the present disclosure, it will be appreciated that a driver amplifier 200 implemented in accordance with various examples set forth herein may provide an over current protection circuit that continuously monitors and limits an amplified output current drive signal, and improves over current protection stability and driver amplifier performance. The driver amplifier 200 incorporates PMOSFET clamp device 210 connected to gate terminal of NMOSFET 114 power device to control the gate voltage of NMOSFET 114 and NMOSFET clamp device 230 connected to gate terminal of PMOSFET 124 power device to control the gate voltage of PMOSFET 124, all to optimize over current protection stability without the need for additional stabilizing elements that add to complexity and die size of the driver amplifier.

Where applicable, various examples provided by the present disclosure may be implemented using hardware, software, or combinations of hardware and software. Also, where applicable, the various hardware components and/or software components set forth herein may be combined into composite components comprising software, hardware, and/or both without departing from the spirit of the present disclosure. Where applicable, the various hardware components and/or software components set forth herein may be separated into sub-components comprising software, hardware, or both without departing from the scope of the present disclosure. In addition, where applicable, it is contemplated that software components may be implemented as hardware components and vice-versa.

The foregoing disclosure is not intended to limit the present disclosure to the precise forms or particular fields of use disclosed. As such, it is contemplated that various alternate examples and/or modifications to the present disclosure, whether explicitly described or implied herein, are possible in light of the disclosure. Having thus described examples of the present disclosure, persons of ordinary skill in the art will recognize that changes may be made in form and detail without departing from the scope of the present disclosure. Thus, the present disclosure is limited only by the claims.

What is claimed is:

1. A system comprising:
   a first n-channel metal-oxide semiconductor field-effect transistor (NMOSFET) power device configured to generate a current signal at a drain terminal of the first NMOSFET power device;
   a current comparison amplifier including a second NMOSFET power device and a reference current source, the current comparison amplifier configured to:
     receive the current signal from the first NMOSFET power device at a gate terminal of the second NMOSFET power device;
     generate a replica current signal proportional to the current signal at a drain terminal of the second NMOSFET power device;
     determine a difference between the replica current signal and a reference current signal generated by the reference current source; and
     drive a current comparison amplifier voltage output signal based on the difference between the replica current signal and the reference current signal; and
   a p-channel metal-oxide semiconductor field-effect transistor (PMOSFET) clamp device including a source terminal coupled to a gate terminal of the first NMOSFET power device and configured to limit a voltage at the gate terminal of the first NMOSFET power device responsive to the current comparison amplifier voltage output signal.

2. The system of claim 1, wherein the PMOSFET clamp device limits the voltage based on a pre-determined maximum current signal.

3. The system of claim 1, wherein the replica current signal is a scaled current signal proportional to the current signal by a factor of N.

4. The system of claim 1, further comprising:
   a first PMOSFET power device configured to generate a second current signal at a drain terminal of the first PMOSFET power device;
   a second current comparison amplifier including a second PMOSFET power device and a second reference current source, the current comparison amplifier configured to:
     receive the second current signal from the first PMOSFET power device at a gate terminal of the second PMOSFET power device;
     generate a second replica current signal proportional to the second current signal at a drain terminal of the second PMOSFET power device;
     determine a difference between the second replica current signal and a second reference current signal generated by the second reference current source; and
     drive a second current comparison amplifier voltage output signal based on the difference; and
   an NMOSFET clamp device including a source terminal coupled to a gate terminal of the first PMOSFET power device and configured to limit a second voltage at the gate terminal of the first PMOSFET power device responsive to the second current comparison amplifier voltage output signal.

5. The system of claim 4, wherein the NMOSFET clamp device limits the voltage based on a pre-determined minimum current signal.

6. The system of claim 4, wherein the second replica current signal is a second scaled current signal proportional to the second current signal.

7. The system of claim 4, further comprising a first stage amplifier configured to provide an input drive signal at the gate terminal of the first NMOSFET power device and the gate terminal of the first PMOSFET power device.

8. A system comprising:
   a first p-channel metal-oxide semiconductor field-effect transistor (PMOSFET) power device configured to generate a current signal at a drain terminal of the first PMOSFET power device;
   a current comparison amplifier including a second PMOSFET power device and a reference current source, the current comparison amplifier configured to:
     receive the current signal from the first PMOSFET power device at a gate terminal of the second PMOSFET power device;
     generate a replica current signal proportional to the current signal at a drain terminal of the second PMOSFET power device;
     determine a difference between the replica current signal and a reference current signal generated by the reference current source; and
     drive a current comparison amplifier voltage output signal based on the difference; and
   an n-channel metal-oxide semiconductor field-effect transistor (NMOSFET) clamp device including a source terminal coupled to a gate terminal of the first PMOSFET power device and configured to limit a voltage at the gate terminal of the first PMOSFET power device responsive to the current comparison amplifier voltage output signal.

9. The system of claim 8, wherein the NMOSFET clamp device limits the voltage based on a pre-determined minimum current signal.

10. The system of claim 8, wherein the replica current signal is a scaled current signal proportional to the current signal by a factor of N.

11. A method comprising:
    receiving a current signal from a first n-channel metal-oxide semiconductor field-effect transistor (NMOSFET) power device at a gate terminal of a second NMOSFET power device;
    generating a replica current signal proportional to the current signal at a drain terminal of the second NMOSFET power device;

determining a difference between the replica current signal and a reference current signal generated by a reference current source;

driving a current comparison amplifier voltage output signal based on the difference; and limiting, by a p-channel metal-oxide semiconductor field-effect transistor (PMOSFET) clamp device, a voltage at a gate terminal of the first NMOSFET power device responsive to the current comparison amplifier voltage output signal.

12. The method of claim 11, wherein limiting the voltage is based on a pre-determined maximum current signal.

13. The method of claim 11, wherein the replica current signal is a scaled current signal proportional to the current signal by a factor of N.

14. The method of claim 11, further comprising:

receiving a second current signal from a first PMOSFET power device at a gate terminal of a second PMOSFET power device;

generating a second replica current signal proportional to the second current signal at a drain terminal of the second PMOSFET power device;

determining a difference between the second replica current signal and a second reference current signal generated by a second reference current source;

driving a second comparison amplifier voltage output signal based on the difference; and limiting, by an NMOSFET clamp device, a second voltage at the gate terminal of the first PMOSFET power device responsive to the second comparison amplifier voltage output signal.

15. The method of claim 14, wherein limiting the voltage is based on a pre-determined minimum current signal.

16. The method of claim 14, further comprising:

providing, by a first stage amplifier, an input drive signal at the gate terminal of the first NMOSFET power device and the gate terminal of the first PMOSFET power device.

\* \* \* \* \*